(12) United States Patent
Leendertz et al.

(10) Patent No.: US 10,985,248 B2
(45) Date of Patent: *Apr. 20, 2021

(54) SIC POWER SEMICONDUCTOR DEVICE WITH INTEGRATED SCHOTTKY JUNCTION

(71) Applicant: Infineon Technologies AG, Neubiberg (DE)

(72) Inventors: Caspar Leendertz, Munich (DE); Romain Esteve, Munich (DE); Anton Mauder, Kolbermoor (DE); Andreas Meiser, Sauerlach (DE); Bernd Zippelius, Erlangen (DE)

(73) Assignee: Infineon Technologies AG, Neubiberg (DE)

( * ) Notice: Subject to any disclaimer, the term of this patent is extended or adjusted under 35 U.S.C. 154(b) by 91 days.

This patent is subject to a terminal disclaimer.

(21) Appl. No.: 16/354,973

(22) Filed: Mar. 15, 2019

(65) Prior Publication Data
US 2020/0161433 A1 May 21, 2020

Related U.S. Application Data

(63) Continuation-in-part of application No. 16/193,161, filed on Nov. 16, 2018.

(51) Int. Cl.
*H01L 29/16* (2006.01)
*H01L 29/78* (2006.01)
(Continued)

(52) U.S. Cl.
CPC ...... *H01L 29/1608* (2013.01); *H01L 29/0865* (2013.01); *H01L 29/1095* (2013.01);
(Continued)

(58) Field of Classification Search
CPC .......... H01L 29/1608; H01L 29/0865; H01L 29/1095; H01L 29/4236; H01L 29/66734; H01L 29/7806; H01L 29/7813
See application file for complete search history.

(56) References Cited

U.S. PATENT DOCUMENTS 4,823,172 A 4/1989 Mihara
6,008,520 A 12/1999 Darwish et al.
(Continued)

FOREIGN PATENT DOCUMENTS

DE 102004029297 A1 11/2005
DE 102005041358 A1 3/2007
(Continued)

OTHER PUBLICATIONS

Aichinger, Thomas, et al., "SiC Trench Transistor Device and Methods of Manufacturing Thereof", U.S. Appl. No. 16/193,296, filed Nov. 16, 2018.
(Continued)

*Primary Examiner* — Michael Jung
(74) *Attorney, Agent, or Firm* — Murphy, Bilak & Homiller, PLLC

(57) ABSTRACT

Embodiments of SiC devices and corresponding methods of manufacture are provided. In some embodiments, the SiC device has shielding regions at the bottom of some gate trenches and non-linear junctions formed with the SiC material at the bottom of other gate trenches. In other embodiments, the SiC device has the shielding regions at the bottom of the gate trenches and arranged in rows which run in a direction transverse to a lengthwise extension of the trenches. In still other embodiments, the SiC device has the shielding regions and the non-linear junctions, and wherein the shielding regions are arranged in rows which run in a direction transverse to a lengthwise extension of the trenches.

20 Claims, 16 Drawing Sheets

(51) Int. Cl.
- *H01L 29/423* (2006.01)
- *H01L 29/66* (2006.01)
- *H01L 29/08* (2006.01)
- *H01L 29/10* (2006.01)

(52) U.S. Cl.
CPC .... *H01L 29/4236* (2013.01); *H01L 29/66734* (2013.01); *H01L 29/7806* (2013.01); *H01L 29/7813* (2013.01)

(56) References Cited

U.S. PATENT DOCUMENTS

| | | | |
|---|---|---|---|
| 7,582,922 | B2 | 9/2009 | Werner |
| 7,700,971 | B2 | 4/2010 | Ueno |
| 7,872,308 | B2 | 1/2011 | Akiyama et al. |
| 7,989,882 | B2 | 8/2011 | Zhang et al. |
| 8,252,645 | B2 | 8/2012 | Hshieh |
| 8,431,470 | B2 | 4/2013 | Lui et al. |
| 8,525,254 | B2 | 9/2013 | Treu et al. |
| 8,637,922 | B1 | 1/2014 | Siemieniec et al. |
| 8,653,589 | B2 | 2/2014 | Hsieh |
| 9,093,522 | B1 | 7/2015 | Zeng et al. |
| 9,136,372 | B2 | 9/2015 | Miyahara et al. |
| 9,293,558 | B2 | 3/2016 | Siemieniec et al. |
| 9,478,655 | B2 | 10/2016 | Siemieniec et al. |
| 9,496,384 | B2 | 11/2016 | Nakano |
| 9,577,073 | B2 | 2/2017 | Esteve et al. |
| 9,837,527 | B2 | 12/2017 | Siemieniec et al. |
| 9,929,265 | B1 * | 3/2018 | Kondo ................... H01L 29/36 |
| 10,211,306 | B2 | 2/2019 | Siemieniec et al. |
| 10,304,953 | B2 | 5/2019 | Aichinger et al. |
| 2003/0020134 | A1 | 1/2003 | Werner et al. |
| 2006/0076617 | A1 | 4/2006 | Shenoy et al. |
| 2006/0246650 | A1 | 11/2006 | Williams et al. |
| 2006/0267085 | A1 | 11/2006 | Matsuura |
| 2008/0121989 | A1 | 5/2008 | Kocon et al. |
| 2008/0315250 | A1 | 12/2008 | Onozawa |
| 2009/0146209 | A1 | 6/2009 | Akiyama et al. |
| 2010/0308401 | A1 | 12/2010 | Narazaki |
| 2011/0284954 | A1 | 11/2011 | Hsieh |
| 2013/0168701 | A1 | 7/2013 | Kiyosawa et al. |
| 2013/0200451 | A1 | 8/2013 | Yilmaz et al. |
| 2013/0313635 | A1 | 11/2013 | Nakano |
| 2013/0341711 | A1 | 12/2013 | Matsumoto et al. |
| 2014/0021484 | A1 | 1/2014 | Siemieniec et al. |
| 2014/0145206 | A1 | 5/2014 | Siemieniec et al. |
| 2014/0145258 | A1 | 5/2014 | Lin |
| 2014/0159053 | A1 | 6/2014 | Chen et al. |
| 2014/0167151 | A1 | 6/2014 | Yen et al. |
| 2014/0210000 | A1 | 7/2014 | Tokuda et al. |
| 2014/0210001 | A1 | 7/2014 | Yamazaki |
| 2016/0163852 | A1 | 6/2016 | Siemieniec et al. |
| 2016/0260829 | A1 | 9/2016 | Aichinger et al. |
| 2017/0236931 | A1 | 8/2017 | Meiser et al. |
| 2017/0345905 | A1 | 11/2017 | Siemieniec et al. |
| 2018/0277637 | A1 | 9/2018 | Meiser et al. |
| 2019/0081170 | A1 | 3/2019 | Kumagai |
| 2019/0109227 | A1 | 4/2019 | Kobayashi et al. |
| 2019/0259842 | A1 | 8/2019 | Basler et al. |
| 2019/0326388 | A1 | 10/2019 | Arai et al. |

FOREIGN PATENT DOCUMENTS

| | | |
|---|---|---|
| DE | 102012211221 A1 | 1/2013 |
| DE | 102013214196 A1 | 1/2014 |
| DE | 102014117780 A1 | 6/2016 |
| DE | 102017108738 A1 | 10/2018 |
| DE | 102017128633 A1 | 6/2019 |
| DE | 102018103973 A1 | 8/2019 |
| JP | 07240409 A | 9/1995 |
| JP | 09260650 A | 10/1997 |
| JP | H1154748 A | 6/1999 |
| JP | 2000031484 A | 1/2000 |
| JP | 2000277734 A | 10/2000 |
| JP | 2007080971 A | 3/2007 |
| JP | 2007129259 A | 5/2007 |
| JP | 2007221012 A | 8/2007 |
| JP | 2008505480 A | 2/2008 |
| JP | 2008108824 A | 5/2008 |
| JP | 2008159916 A | 7/2008 |
| JP | 2009117593 A | 5/2009 |
| JP | 2009187966 A | 8/2009 |
| JP | 2010541288 A | 12/2010 |
| JP | 2012044167 A | 3/2012 |
| JP | 2012151470 A | 8/2012 |
| JP | 2013214661 A | 10/2013 |
| JP | 2014003191 A | 1/2014 |
| JP | 2014075582 A | 4/2014 |
| JP | 2014107571 A | 6/2014 |
| JP | 2014165348 A | 9/2014 |
| WO | 03010812 A1 | 2/2003 |
| WO | 03019623 A2 | 3/2003 |

OTHER PUBLICATIONS

Andreas Meiser, et al., "SiC Power Semiconductor Device with Integrated Body Diode", U.S. Appl. No. 16/193,161, filed Nov. 16, 2018.

Hsu, Fu-Jen, et al., "High Efficiency High Reliability SiC MOSFET with Monolithically Integrated Schottky Rectifier", Proceedings of The 29th International Symposium on Power Semiconductor Devices & ICs, Sapporo, Japan, May 28-Jun. 1, 2017, pp. 45-48.

Jiang, Huaping, et al., "SiC MOSFET with Built-in SBD for Reduction of Reverse Recovery Charge and Switching Loss in 10-kV Applications", Proceedings of The 29th International Symposium on Power Semiconductor Devices & ICs, Sapporo, Japan, May 28-Jun. 1, 2017, pp. 49-52.

Kawahara, Koutarou, et al., "6.5 kV Schottky-Barrier-Diode-Embedded SiC-MOSFET for Compact Full-Unipolar Module", Proceedings of The 29th International Symposium on Power Semiconductor Devices & ICs, Sapporo, Japan, May 28-Jun. 1, 2017, pp. 41-44.

"CMF20120D-Silicon Carbide Power MOSFET 1200V 80 mΩ: Z-Fet MOSFET N-Channel Enhancement Mode", CMF20120D Rev. A, Cree, Inc., 2012, pp. 1-13.

Siemieniec, Ralf, et al., "Semiconductor Device Having a Source Electrode Contact Trench", U.S. Appl. No. 16/256,453, filed Jan. 24, 2019.

* cited by examiner

SIC POWER SEMICONDUCTOR DEVICE WITH INTEGRATED SCHOTTKY JUNCTION

BACKGROUND

Power MOSFET devices usually have an integrated body diode. This includes Si and SiC-based power MOSFET devices. The forward voltage drop of a bipolar SiC diode (about 2.7V to 4V) is considerably higher than the forward voltage drop of a bipolar Si diode (about 0.7V to 1V), which translates to increased diode conduction losses. While the channel of a power MOSFET in reverse conduction mode is usually turned on to reduce the conduction losses, a dead-time is needed in the transition phases where the channel cannot conduct. The dead-time is usually minimized as much as possible, but the length of the dead-time is also related to the application field. For example, the dead-time can be as low as 50 to 100 ns in synchronous rectification stages of low-voltage DC/DC converters, but may reach 1 to 2 µs for high-voltage motor-drive applications. Applications that run at larger switching frequencies generate a higher amount of diode conduction losses. Overall, losses related to the body diode may vary significantly. Particularly for low-voltage power MOSFET devices used at relatively high switching frequencies, the losses may be so large that a Schottky diode or MGD (MOS-gated diode) may be provided to lower the losses due to the lower forward voltage of such devices.

Additionally, the body diode of a SiC MOSFET device can be viewed as a bipolar device the operation of which can cause bipolar degradation effects. The degradation is triggered by recombination energy which is transferred to the crystal and may cause a reconfiguration of the crystal or result in growth of remaining basal plane dislocations. The reconfigured areas may become more resistive, altering the properties of the device. Integration of a unipolar diode such as a Schottky diode can prevent such a degradation mechanism as long as the unipolar diode can conduct the nominal current through the device.

Thus, there is a need for a SiC-based power semiconductor device having an integrated body diode but with reduced conduction losses and reduced bipolar degradation.

SUMMARY

According to an embodiment of a semiconductor device, the semiconductor device comprises: a SiC material of a first conductivity type; a plurality of trenches extending into the SiC material, each trench having opposing sidewalls and a bottom; a first electrode formed in a lower part of the trenches; a second electrode formed in an upper part of the trenches and insulated from the first electrode and the SiC material; a body region of a second conductivity type adjacent the opposing sidewalls of each trench, wherein a conductive channel is configured to form in the body region along the opposing sidewalls of the trenches; a source region of the first conductivity type above the body region and adjacent the opposing sidewalls of each trench; a shielding region of the second conductivity type at the bottom of a first subset of the trenches, each shielding region being electrically connected to the corresponding first electrode through an opening in an insulating material at the bottom of the first subset of trenches; and a non-linear junction formed with the SiC material at the bottom of a second subset of the trenches different than the first subset.

Each of trenches may be stripe-shaped and may extend along a lengthwise extension, which corresponds to the main extension direction of the trench. In this case, the trenches may have the shape of an elongated rectangle in a top view. Lengthwise extensions of neighboring trenches may run in parallel. It may, however, also be possible that the trenches have a quadratic, a hexagonal or a circular shape in a top view.

The non-linear junction may be formed between the SiC material and the first electrode at the bottom of the second subset of trenches. The non-linear junction may be a diode, such as, for instance, a pn diode or a Schottky diode.

Separately or in combination, the first electrode formed in the lower part of the trenches may comprise a highly conducting material (e.g. with an electrical conductivity of above $10^{-4}$ S/cm). For example, the first electrode formed in the lower part of the trenches may comprise a semiconductor material or a metal. In some embodiments, the semiconductor material may be doped polysilicon.

Separately or in combination, a metal may be formed below the first electrode in the second subset of trenches, the non-linear junction is a Schottky junction, and the Schottky junction is formed between the SiC material and the metal at the bottom of the second subset of trenches. Here and in the following, a metal may be an elementary metal or a metal alloy.

Separately or in combination, the first electrode may contact the shielding region at the bottom of the first subset of trenches, e.g. via an ohmic contact.

Separately or in combination, a metal may be formed below the first electrode in the first subset of trenches and the metal may contact the shielding region at the bottom of the first subset of trenches.

Separately or in combination, the shielding regions and the non-linear junctions may be arranged in an alternating manner below the plurality of trenches. In some embodiments, the shielding regions are arranged only at the bottom of the first subset of trenches and the non-linear junctions are arranged only at the bottom of the second subset of trenches. In this case, the shielding regions and the non-linear junctions may alternate along a direction transverse (e.g. with an angle of at least 40° and at most 140°) to the sidewalls of the trenches (e.g., transverse to the lengthwise extension in case of stripe-shaped trenches). In other embodiments, at least one of the shielding regions and the non-linear junctions may be arranged at the bottom of the first subset of trenches and at the bottom of the second subset of trenches. In this case, the shielding regions and the non-linear junctions may alternate at least along a direction parallel to the bottom of the trenches (e.g., along the lengthwise extension in case of stripe-shaped trenches). In addition, the shielding regions and the non-linear junctions may also alternate along one of the trenches, in particular along the lengthwise extension.

Separately or in combination, the shielding regions may be arranged at corners of a grid and/or the shielding regions may form part of a grid. For example, the shielding regions and the trenches may be arranged in a grid or the shielding regions alone may be arranged in a grid. It is possible for the shielding regions to have a different pitch than the trenches. The pitch of the trenches (shielding regions) may be a center-to-center distance of neighboring trenches (neighboring shielding regions). The meshes of the grid may be rectangular or may have the shape of a rhombus.

Separately or in combination, the shielding regions may extend in parallel with one another in lines that run parallel to the trenches. In some embodiments, the shielding region may extend along an entire trench. Each shielding region may be assigned to one of the trenches of the first subset of trenches in a one-to-one manner.

Separately or in combination, the insulating material may be present at the bottom of the trenches (e.g. at the bottom the trenches of the first subset of trenches) between adjacent ones of the shielding regions.

Separately or in combination, some of the shielding regions may be segmented and other ones of the shielding regions may be contiguous over a length of the trenches. The shielding regions may be arranged at the bottom of the first subset of trenches and at the bottom of the second subset of trenches. For example, the segmented shielding regions may be arranged at the bottom of the second subset of trenches and the contiguous shielding regions may be arranged at the bottom of the first subset of trenches. "Contiguous" in this context may mean that the shielding region extends along at least 90% of the trench in a lengthwise extension of the trench. "Segmented" may mean that a plurality of shielding regions are arranged at the bottom of each trench, wherein shielding regions of one trench are not interconnected by parts of the shielding regions. In the latter case, shielding regions of neighboring trenches may be interconnected.

Separately or in combination, the shielding regions may be arranged in rows which run in a direction transverse (e.g., with an angle of at least 40° and at most 140°) to a lengthwise extension of the trenches.

According to another embodiment of a semiconductor device, the semiconductor device comprises: a SiC material of a first conductivity type; a plurality of trenches extending into the SiC material, each trench having opposing sidewalls and a bottom; a first electrode formed in a lower part of the trenches; a second electrode formed in an upper part of the trenches and insulated from the first electrode and the SiC material; a body region of a second conductivity type adjacent the opposing sidewalls of each trench, wherein a conductive channel is configured to form in the body region along the opposing sidewalls of the trenches; a source region of the first conductivity type above the body region and adjacent the opposing sidewalls of each trench; and a shielding region of the second conductivity type at the bottom of the trenches and electrically connected to the corresponding first electrode through an opening in an insulating material at the bottom of the trenches, wherein the shielding regions are arranged in rows which run in a direction transverse to a lengthwise extension of the trenches.

The insulating material may be present at the bottom of the trenches between adjacent rows of the shielding regions.

Separately or in combination, the semiconductor device may further comprise a non-linear junction formed with the SiC material at the bottom of the trenches.

Separately or in combination, a metal may be formed below the first electrode in the trenches, the non-linear junction is a Schottky junction, and the Schottky junction is formed between the SiC material and the metal at the bottom of the trenches.

Separately or in combination, the insulating material may be present at the bottom of the trenches between adjacent rows of the shielding regions to divide the non-linear junction in the same trench into a plurality of non-linear junction segments separated from one another by the insulating material.

Separately or in combination, the shielding regions may be contiguous over a length of the trenches.

Separately or in combination, the rows of shielding regions may run in a direction orthogonal or nearly orthogonal to the lengthwise extension of the trenches.

According to another embodiment of a semiconductor device, the semiconductor device comprises: a SiC material of a first conductivity type; a gate trench extending into a first main surface of the SiC material and having sidewalls and a bottom; a buried electrode formed in a lower part of the gate trench; a gate electrode formed in an upper part of the gate trench and insulated from the buried electrode and the SiC material; a body region of a second conductivity type adjacent the sidewalls of the gate trench, wherein a conductive channel is configured to form in the body region along the sidewalls of the gate trench; a source region of the first conductivity type above the body region and adjacent the sidewalls of the gate trench; and a shielding region of the second conductivity type in contact with the buried electrode at the bottom of the gate trench, wherein the buried electrode is in contact with the SiC material at the sidewalls in the lower part of the gate trench to form a Schottky junction.

The semiconductor device may further comprise a contact trench extending into the first main surface of the SiC material and extending lengthwise in a direction which is transverse to a lengthwise extension direction of the gate trench, wherein the contact trench is filled with a material that provides a point of contact for the buried electrode at the first main surface of the SiC material.

Separately or in combination, a material of the buried electrode may extend to the first main surface of the SiC material adjacent the gate trench.

Separately or in combination, the semiconductor device may further comprise a contact region of the second conductivity type extending through the source region and into the body region, wherein the contact region is doped more heavily than the body region. The contact region of the second conductivity type may extend in a same lengthwise direction as the gate trench. Alternatively, the contact region of the second conductivity type may extend lengthwise in a first direction which is transverse to a lengthwise extension direction of the gate trench.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein may provide a SiC-based power semiconductor device with reduced conduction losses and reduced bipolar degradation. In some embodiments, the SiC device has shielding regions at the bottom of some gate trenches and non-linear junctions formed with the SiC material at the bottom of other gate trenches. In other embodiments, the SiC device has the shielding regions at the bottom of the gate trenches and arranged in rows which run in a direction transverse to a lengthwise extension of the gate trenches. In still other embodiments, the SiC device has the shielding regions and the non-linear junctions, and the shielding regions are arranged in rows which run in a direction transverse to a lengthwise extension of the gate trenches.

Figure 1:
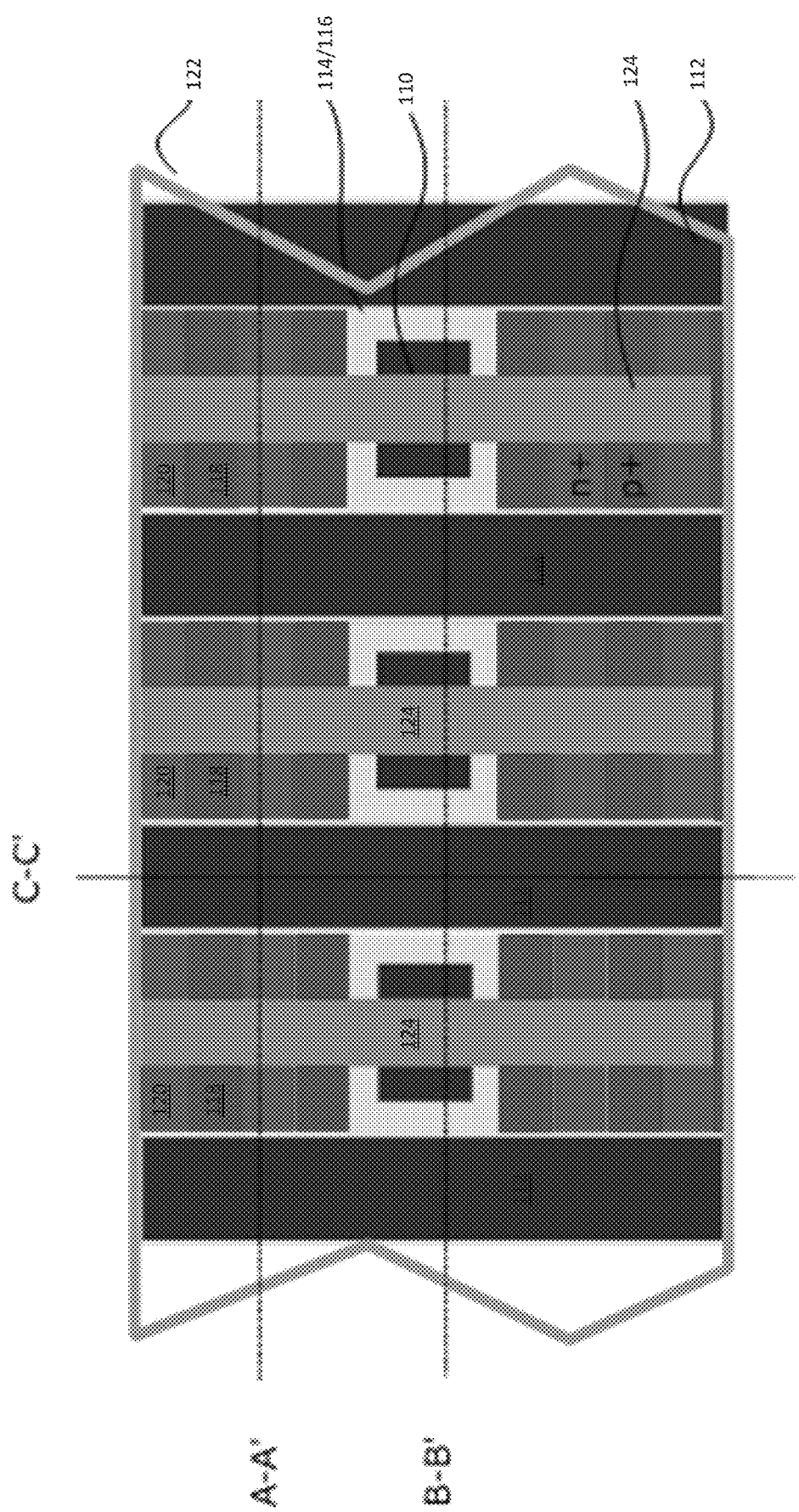
FIG. 1 illustrates a partial top plan view of an embodiment of a semiconductor device having shielding regions formed in a SiC material.
Figure 2:
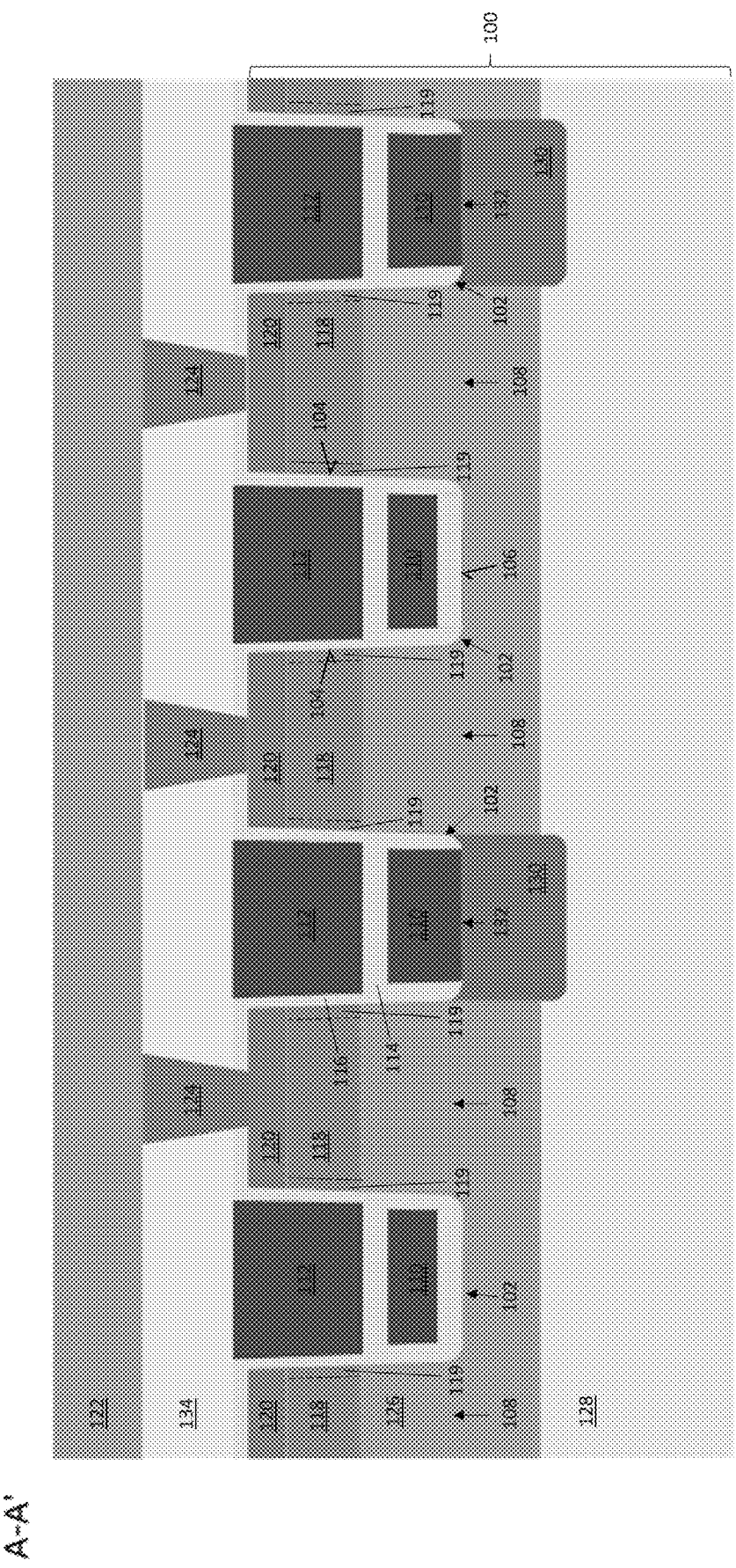
FIG. 2 illustrates a cross-sectional view of the semiconductor device along the line labelled A-A' in FIG. 1.
Figure 3:
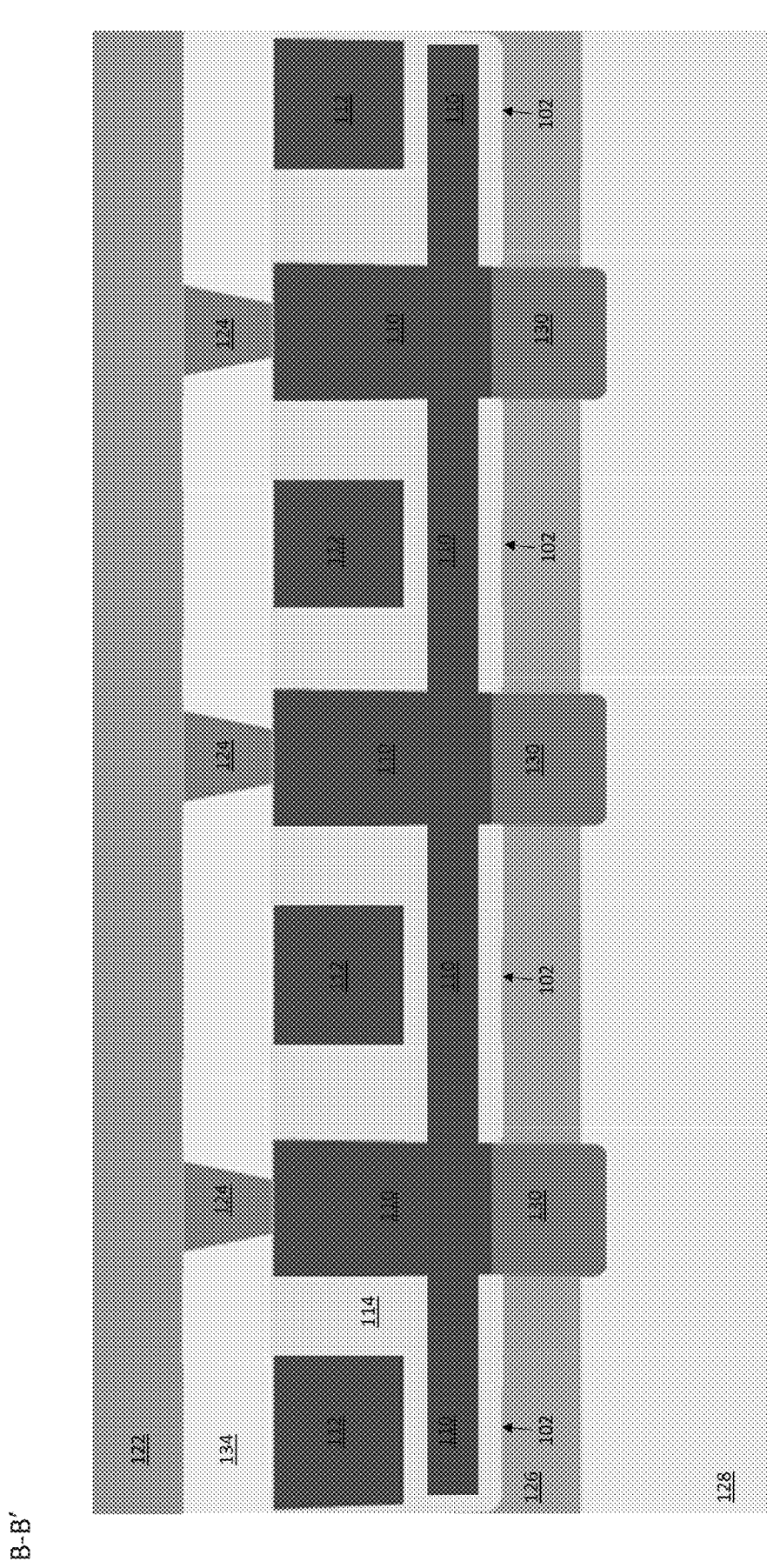
FIG. 3 illustrates a cross-sectional view of the semiconductor device along the line labelled B-B' in FIG. 1.
Figure 4:
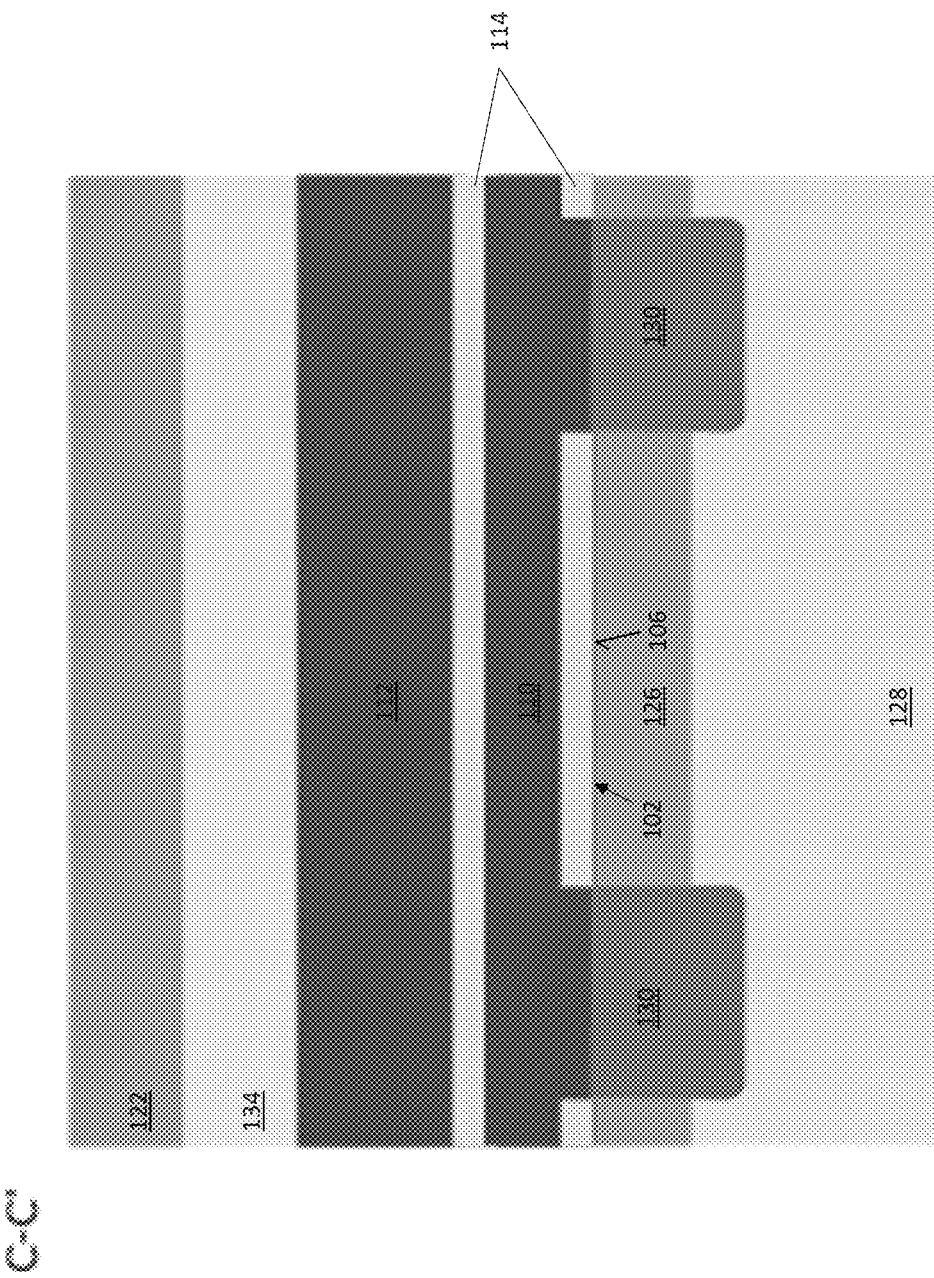
FIG. 4 illustrates a cross-sectional view of the semiconductor device along the line labelled C-C' in FIG. 1.

FIG. 1 illustrates a partial top plan view of an embodiment of a semiconductor device. FIG. 2 illustrates a cross-sectional view of the semiconductor device along the line labelled A-A' in FIG. 1. FIG. 3 illustrates a cross-sectional view of the semiconductor device along the line labelled B-B' in FIG. 1. FIG. 4 illustrates a cross-sectional view of the semiconductor device along the line labelled C-C' in FIG. 1. The semiconductor device may be a power semiconductor device such as a power MOSFET.

The semiconductor device includes a SiC material 100 of a first conductivity type. The SiC material 100 may include one or more SiC epitaxial layers grown on a substrate (not shown and/or removed after epitaxial growth). In the case of an n-channel power MOSFET, the SiC material 100 has n-type background doping. In the case of a p-channel power MOSFET, the SiC material 100 has p-type background doping.

Gate trenches 102 extend into the SiC material 100, each gate trench 102 having opposing sidewalls 104 and a bottom 106. Mesas 108 of the SiC material 100 are present between adjacent ones of the gate trenches 102. A buried electrode 110 is formed in a lower part of the gate trenches 102. The buried electrodes 110 may be electrically connected to source potential, e.g., in the case of a power MOSFET device. A gate electrode 112 is formed in an upper part of the gate trenches 102. The buried electrodes 110 and the gate electrodes 112 are electrically conductive and may be formed from doped polysilicon such as p+ polysilicon, from metal, etc. Each gate electrode 112 is insulated from the underlying buried electrode 110 by an insulating material 114 such as a field oxide. The gate electrodes 112 are also insulated from the SiC material 100 by a gate dielectric 116. The field and gate dielectrics 114, 116 may comprise the same or different materials. For example, the field dielectric 114 may be a thicker oxide and the gate dielectric 116 may be a thinner oxide.

A body region 118 of a second conductivity type is formed in the SiC mesas 108 adjacent the opposing sidewalls 104 of each gate trench 102. A conductive channel 119 forms in the body region 118 along the gate dielectric 116 lining adjacent sidewalls 104 of neighboring gate trenches 102, upon application of a suitable gate voltage to the gate electrodes 112. A source region 120 of the first conductivity type is formed above the body region 118 in the SiC mesas 108 and adjacent the opposing sidewalls 104 of each gate trench 102. In the case of an n-channel power MOSFET, the body regions 118 have p-type conductivity and the source regions 120 have n-type conductivity. In the case of a p-channel power MOSFET, the body regions 118 have n-type conductivity and the source regions 120 have p-type conductivity.

A channel contact region (out-of-view) of the second conductivity type may be formed above each body region 118 in a different part of the SiC mesas 108 than the corresponding source region 120. The channel contact regions are doped more heavily than the body regions 118, and provide an ohmic connection between an overlying source metal layer 122 and the body regions 118. Only the outline of the source metal layer 122 is shown in FIG. 1, so as to not obstruct other regions of the device below the source metal layer 122. The source regions 120 are in ohmic connection with the source metal layer 122. Conductive contacts 124 extending between the overlying source metal layer 122 and the channel contact regions and the source regions 120 complete the respective ohmic connections. Signals applied to the gate electrodes 112 control the conductive state of the body regions 118, thereby controlling current flow between the source regions 120 and an underlying current distribution layer 126 formed in the SiC material 100. A drift region 128 is formed in the SiC material 100 below the current distribution layer 126. A drain/collector region of the semiconductor device is below the drift region 128 and not shown for ease of illustration.

The semiconductor device also includes a shielding region 130 of the second conductivity type at the bottom 106 of a first subset of the gate trenches 102. Each shielding region 130 is electrically connected to the corresponding buried electrode 110 in the lower part of the first subset of gate trenches 102 through an opening 132 in the insulating material 114 at the bottom 106 of the first subset of gate trenches 102. For example, the shielding regions 130 may be in direct contact with the buried electrodes 110 at the bottom 106 of the first subset of gate trenches 102. In other cases, a metal or other type of electrically conductive material may be provided between the buried electrodes 110 and the respective shielding regions 103. In each case, the shielding regions 130 are at the same potential as the buried electrodes 110. The buried electrodes 110 and the shielding regions 130 may be electrically connected to the source metal layer 122 through conductive contacts 124 which extend from the source metal layer 122 to the buried electrodes 110 through an interlayer dielectric 136, e.g., as shown in FIG. 3. The interlayer dielectric 136 is not shown in FIG. 1, so as to not obstruct other regions of the device below the interlayer dielectric 136. The buried electrodes 110 and the shielding regions 130 included in the semiconductor device may instead be electrically connected to a potential other than source potential.

When turning off the semiconductor device via appropriate control of the signal applied to the gate electrodes 112, the shielding regions 130 are at source (or other) potential suitable to build-up and a positive voltage in the SiC material 100. The shielding regions 130 and the SiC material 100 are of the opposite conductivity type, and a blocking voltage builds up between these oppositely doped regions. The shielding regions 130 deplete all or most of the oppositely-doped SiC material 100 near the bottom 106 of the gate trenches 102, protecting the gate dielectric 116 from excessive electric fields at the interfaces between the gate trenches 102 and the SiC material 100. That is, the shielding regions 130 take up most of the electric field that builds up in the oppositely-doped SiC material 100 during blocking operation of the semiconductor device. In wideband semiconductor devices such as SiC devices, the electric field that builds up in the wideband semiconductor material 100 is approximately at the same level as the maximum allowed electric field for the gate dielectric 116. The shielding regions 130 provided at the bottom 106 of the first subset of gate trenches 102 protect against overstressing of the gate dielectric 116, ensuring reliable operation.

The shielding regions 130 may be arranged at corners of a grid and/or the shielding regions 130 may form part of a grid. For example, the shielding regions 130 and the gate trenches 102 may be arranged in a grid, or the shielding regions 130 alone may be arranged in a grid. The shielding regions 130 may have the same or different pitch than the gate trenches 102 where the pitch of the gate trenches 102 (or shielding regions 130) may be a center-to-center distance of neighboring trenches 102 (or neighboring shielding regions 130). Meshes of the grid may be rectangular or may have the shape of a rhombus.

The shielding regions 130 may be provided at the bottom of every second gate trench 102, every third gate trench 102, etc. The layout of the shielding regions 130 may be formed independent from the gate trench pitch, e.g., by providing a mask layer for the shielding region implant in the region of the trench structure. A deep implantation process is performed with the mask layer. In one embodiment, a multi-layer epitaxy process is used. For example, a first epitaxial layer may be formed, followed by the shielding region implant (e.g. p-type dopant species in the case of an n-channel device, or n-type dopant species in the case of a p-channel device), followed by formation of another epitaxial layer to avoid dopant tailing at the front side of the semiconductor device. Dopant tailing towards the front side of the device may effect device performance, e.g., by inhibiting the inversion channel which in turn reduces channel width. In another embodiment, the complete epitaxial structure is formed and then the shielding region implant is performed. The dopant species used to form the shielding regions 130 may be implanted into the SiC material 100 through the bottom 106 of the gate trenches 102. In this case, the insulating material 114 at the bottom of every second, third, etc. gate trench 102 may be opened for the shielding region implant followed by the formation of contacts between the buried electrode 110 or other material at the bottom 104 of the gate trenches 102 and the implanted shielding regions 130. In another embodiment, the dopant species used to form the shielding regions 130 may be implanted into the SiC material 100 before the gate trenches 102 are formed. Typical p-type dopant species for SiC include beryllium, boron, aluminum, and gallium. Typical n-type dopant species for SiC include nitrogen and phosphorus. Other types of dopant species may be used to form the shielding regions 130.

The shielding regions 130 may be varied in the lengthwise direction of the gate trenches 102 as shown in FIG. 4. FIG. 4 is a cross-sectional view of the semiconductor device along the line labelled C-C' in FIG. 1, which is along the lengthwise direction of one gate trench 102. According to this embodiment, the shielding regions 130 extend in parallel with one another in lines that run parallel to the gate trenches 102. Insulating material 114 is present at the bottom 106 of the gate trenches 102 between adjacent ones of the shielding regions 130 according to this embodiment, effectively isolating the shielding regions 130 from one another by the insulating material 114 which remains in the bottom 106 of the gate trenches 102.

Figure 5:
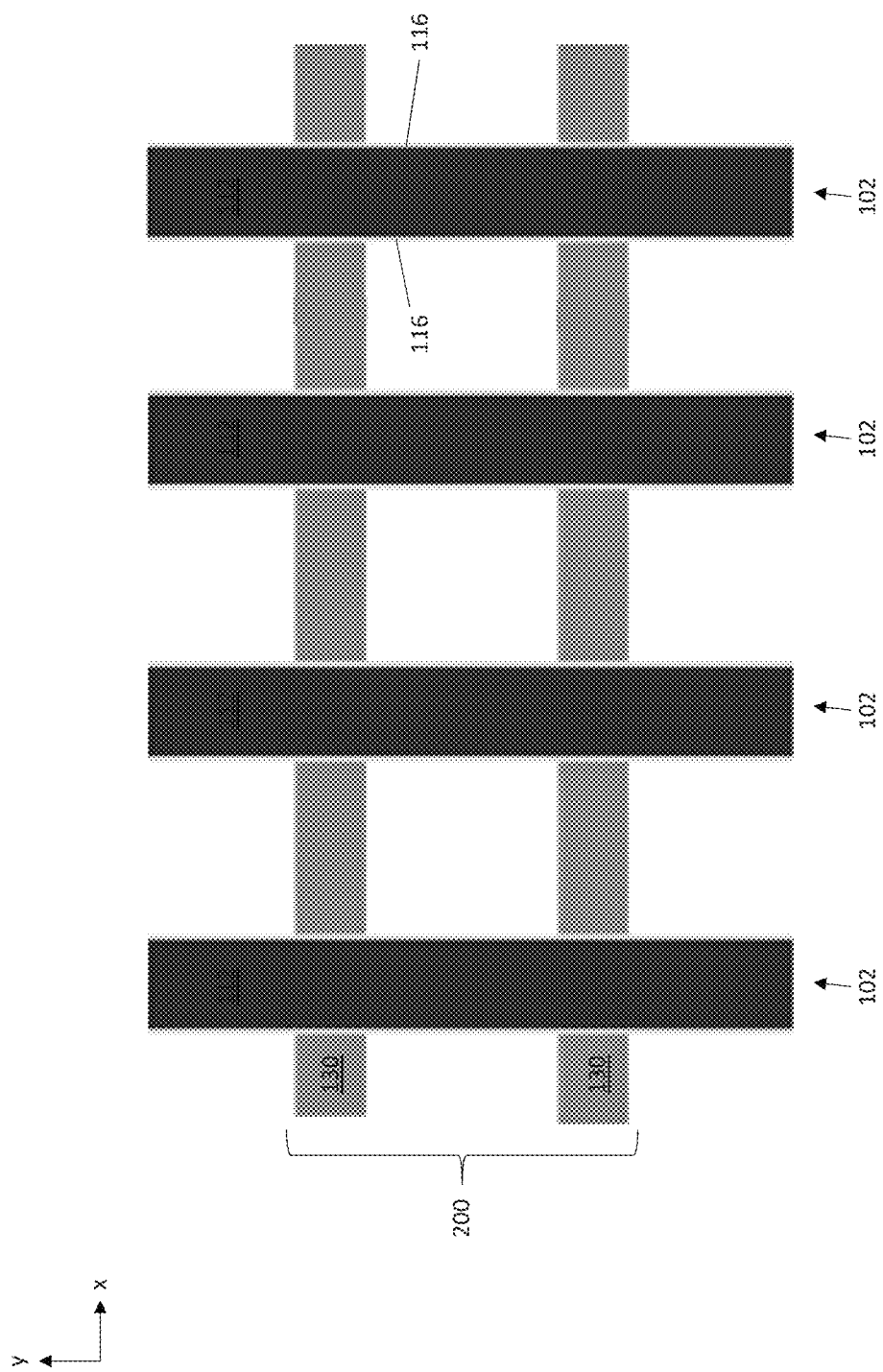
FIG. 5 illustrates an embodiment of a layout in which the shielding regions are arranged in rows which run in a direction transverse to a lengthwise extension of gate trenches included in the device.

FIG. 5 illustrates an embodiment of a layout for the shielding regions 130 in which the shielding regions 130 are arranged in rows 200 which run in a direction (x) transverse to the lengthwise extension (y) of the gate trenches 102. Two rows 200 of shielding regions 130 are shown in FIG. 5 for ease of illustration only. The semiconductor device may include any desired number of rows 200 of shielding regions 130. The arrangement of shielding regions 130 is independent from the gate trench pitch, avoiding misalignment issues between the shielding regions 130 and the gate trenches 102. In one embodiment, the direction (x) in which the rows 200 of shielding regions 130 run is orthogonal or nearly orthogonal to the lengthwise extension (y) of the gate trenches 102. The term "nearly orthogonal" as used herein means that the rows 200 of shielding regions 130 may not run precisely orthogonal to the lengthwise extension (y) of the gate trenches 102, e.g., due to process tolerance.

The shielding regions 130 may be contiguous over the length of the gate trenches 102, as shown in FIG. 5. Alternatively, at least some of the shielding regions 130 may be segmented over the length of the corresponding gate trenches 102. In the case of segmented shielding regions 130, the insulating material 114 may be present at the bottom 106 of the gate trenches 102 between adjacent rows 200 of the shielding regions 130, e.g., as shown in FIG. 3. In either case, the dopant species used to form the shielding regions 130 is implanted into the SiC material 100 before the gate trenches 102 are formed in the embodiment illustrated in FIG. 5.

Figure 6:
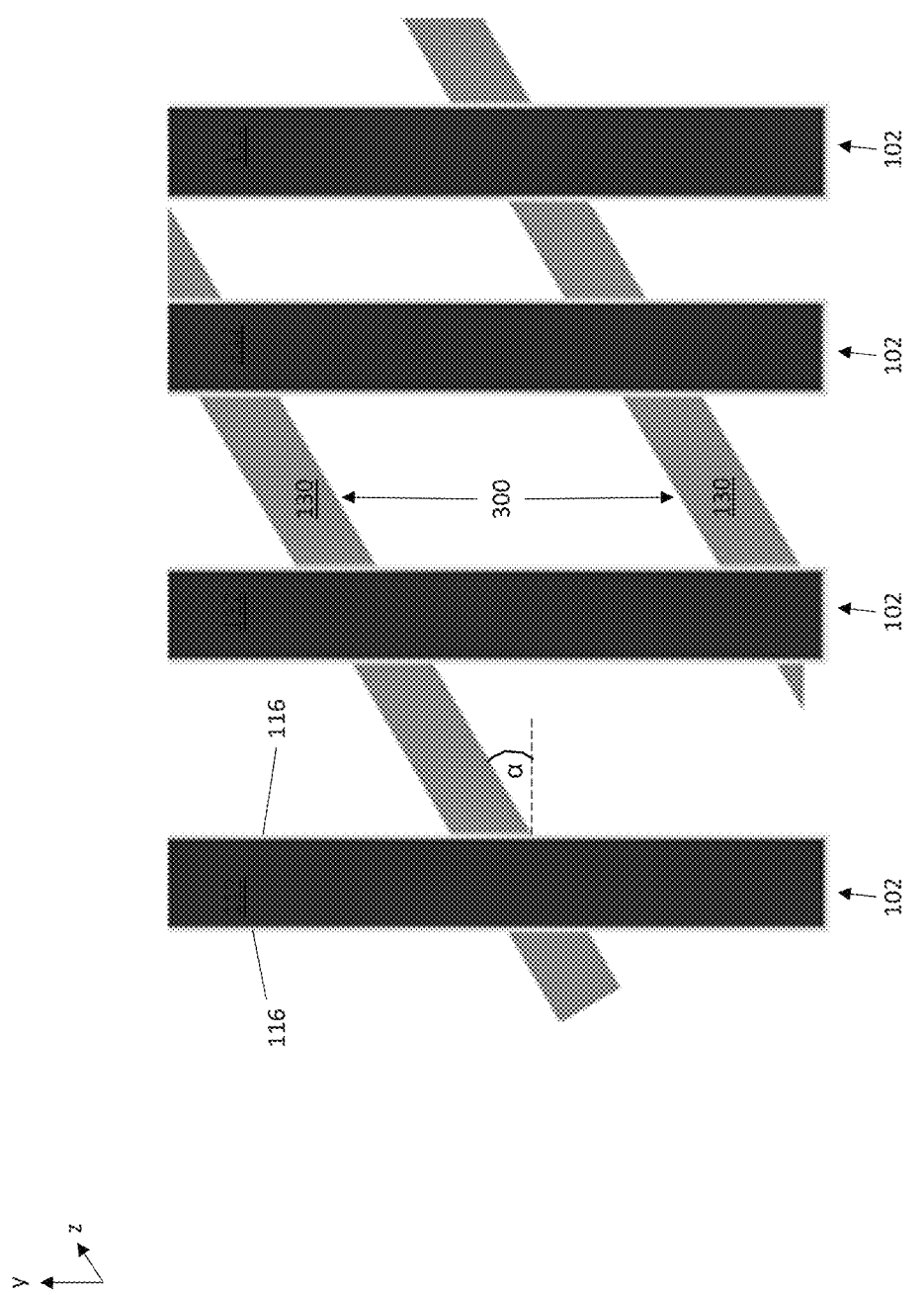
FIG. 6 illustrates another embodiment of a layout in which the shielding regions are arranged in rows which run in a direction transverse to a lengthwise extension of gate trenches included in the device.

FIG. 6 illustrates another embodiment of a layout for the shielding regions 130 in which the shielding regions 130 are arranged in rows 300 which run in a direction (z) transverse to the lengthwise extension (y) of the gate trenches 102. Two rows 300 of shielding regions 130 are shown in FIG. 6 for ease of illustration only. The semiconductor device may include any desired number of rows 300 of shielding regions 130. The embodiment shown in FIG. 6 is similar to the embodiment shown in FIG. 5. Different, however, the rows 300 of shielding regions 130 run in a direction (z) transverse but not orthogonal or nearly orthogonal to the lengthwise extension (y) of the gate trenches 102. The transverse angle (a) between the rows 300 of shielding regions 130 and the gate trenches 102 may be determined by the implantation mask used to form the shielding regions 130. Like the embodiment in FIG. 5, the dopant species used to form the rows 300 of shielding regions 130 illustrated in FIG. 6 is implanted into the SiC material 100 before the gate trenches 102 are formed.

Figure 7:
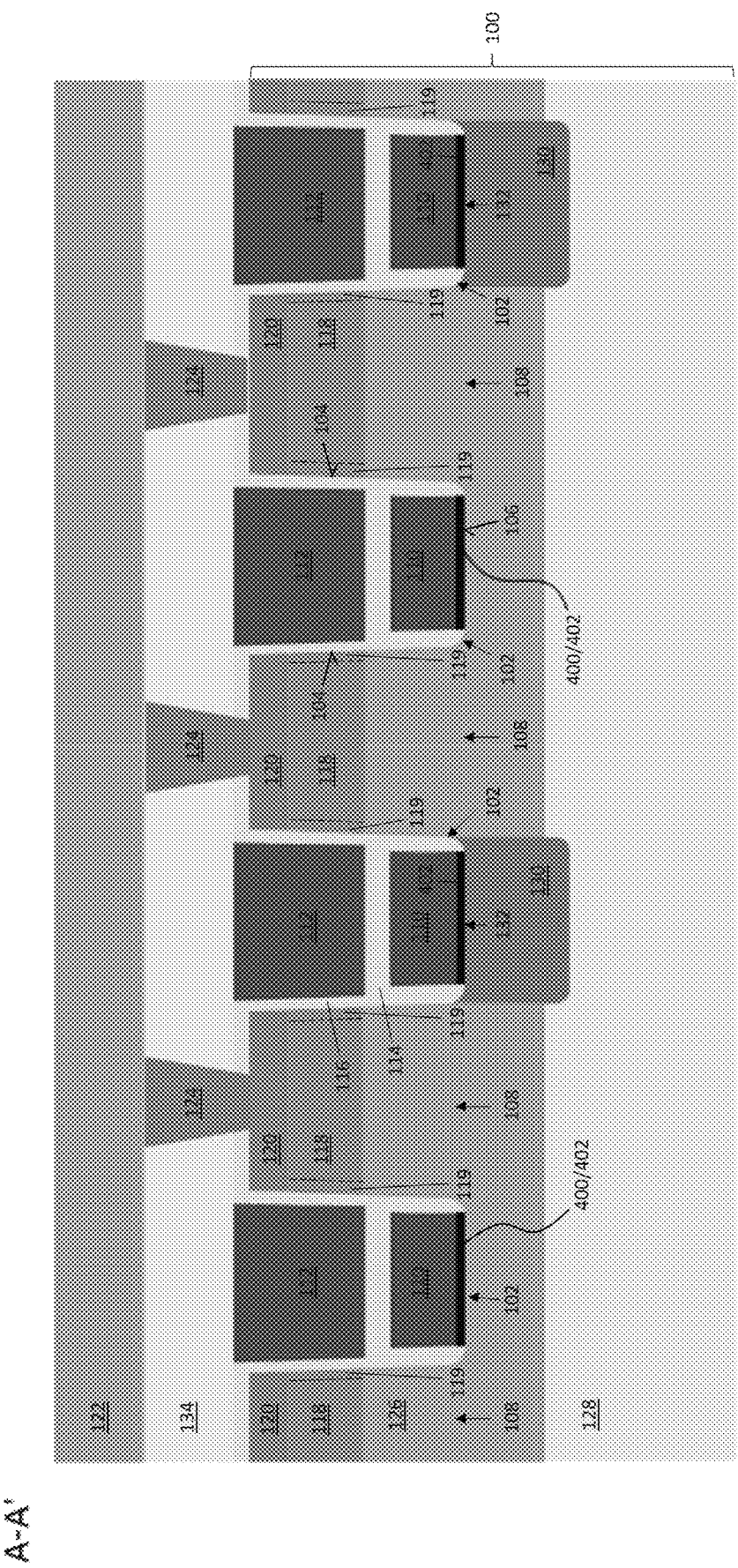
FIGS. 7 through 11 illustrate respective partial cross-sectional views of embodiments of a semiconductor device having shielding regions and non-linear junctions formed in a SiC material.

FIG. 7 illustrates a partial cross-sectional view of another embodiment of a semiconductor device which has a shielding region 130 of the second conductivity type formed at the bottom 106 of a first subset of gate trenches 102. The embodiment shown in FIG. 7 is similar to the embodiment shown in FIGS. 1-4, and is taken along the same cross-sectional line A-A' as shown in FIG. 2. Different, however, the semiconductor device also includes a non-linear junction 400 formed with the SiC material 100 at the bottom 106 of a second subset of the gate trenches 102 different than the first subset. The non-linear junctions 400 have an asymmetric response to an electric field, as opposed to an ohmic junction which has a symmetric response.

The non-linear junctions 400 may be formed by removing the insulating material 114 from the bottom 106 of the second subset of gate trenches 102 and then depositing the buried electrode material or a metal in the trench bottom 106 which contacts the exposed SiC material 100. The shielding regions 130 and the non-linear junctions 400 may be arranged in an alternating manner below the gate trenches 102.

According to the embodiment shown in FIG. 7, a metal 402 such as Ti, TiN, Ti/TiN, Mo, MoN, WN, etc. is formed below the buried electrode 110 at the bottom 106 of the second subset of gate trenches 102, the non-linear junction 400 is a Schottky junction, and the Schottky junction 400 is formed between the SiC material 100 and the metal 402 at the bottom 106 of the second subset of gate trenches 102. The buried electrodes 110 formed in the lower part of the gate trenches 102 may comprise doped polysilicon or metal, as previously described herein. The same or different metal 402 may be formed below the buried electrodes 110 in the first subset of gate trenches 102 so that the shielding regions 130 contact the metal 402 at the bottom 106 of the first subset of gate trenches 102.

The gate electrodes 112 may be formed in the gate trenches 102 with the underlying non-linear junctions 400 by recessing the electrically conductive material used to formed the buried electrodes 110 such as doped polysilicon or metal, forming an intermediate oxide over the recessed buried electrode material, forming the gate dielectric 114 on the trench sidewalls 104, and then forming the gate electrode 112 above the buried electrode 110. The non-linear junctions 400 overcome the bipolar mode/action of SiC in normal operation, effectively integrating a unipolar Schottky diode into the semiconductor device. Alignment issues are also avoided, since the non-linear junctions 400 are formed at the gate trench bottom 106.

Figure 8:
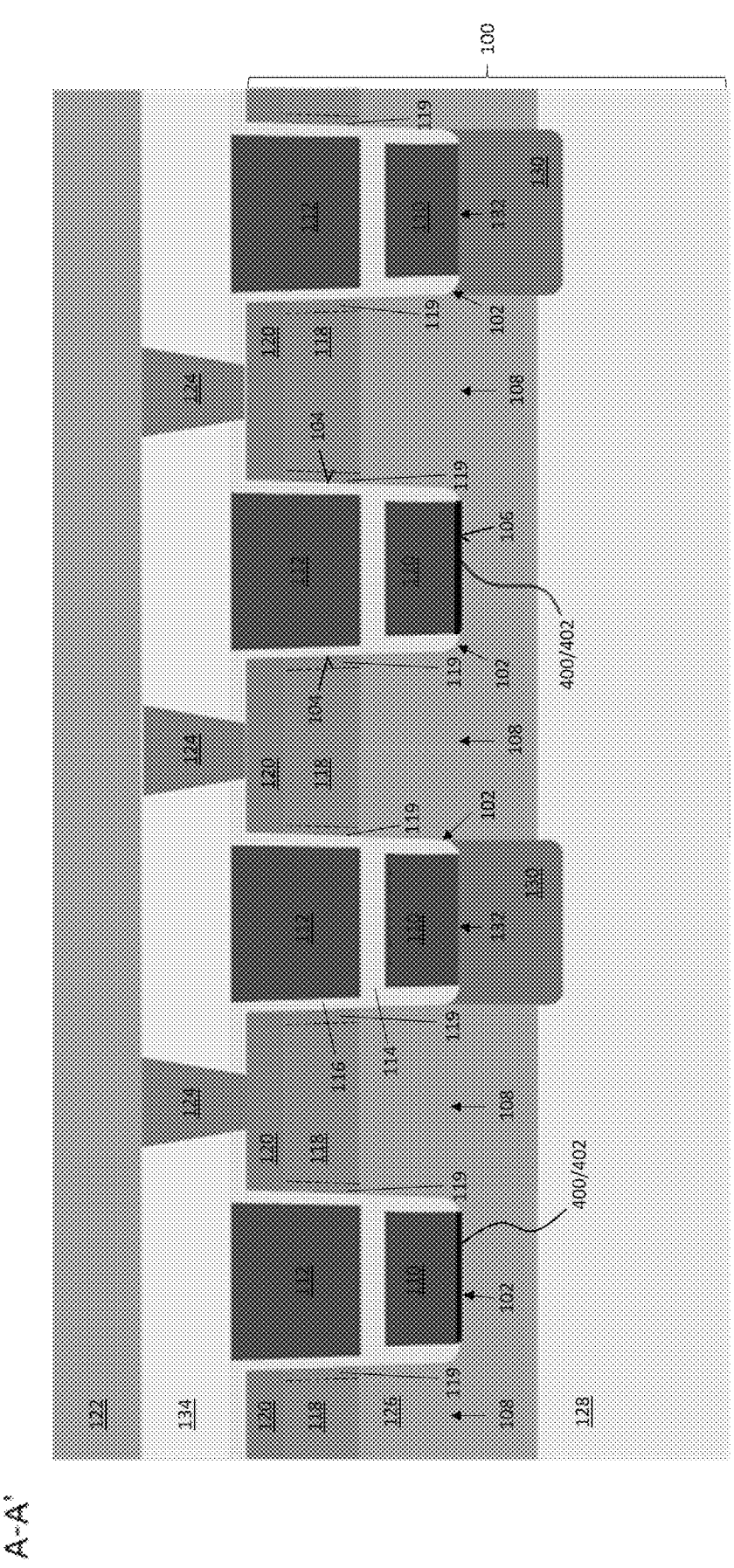

FIG. 8 illustrates a partial cross-sectional view of another embodiment of a semiconductor device which has shielding regions 130 of the second conductivity type and non-linear junctions 400 formed in SiC material 100. The embodiment shown in FIG. 8 is similar to the embodiment shown in FIG. 7. Different, however, the shielding regions 130 formed at the bottom 106 of the first subset of gate trenches 102 contacts the corresponding buried electrode 110. According to this embodiment, no metal is provided between the buried electrodes in the first subset of gate trenches and the underlying shielding regions.

Figure 9:
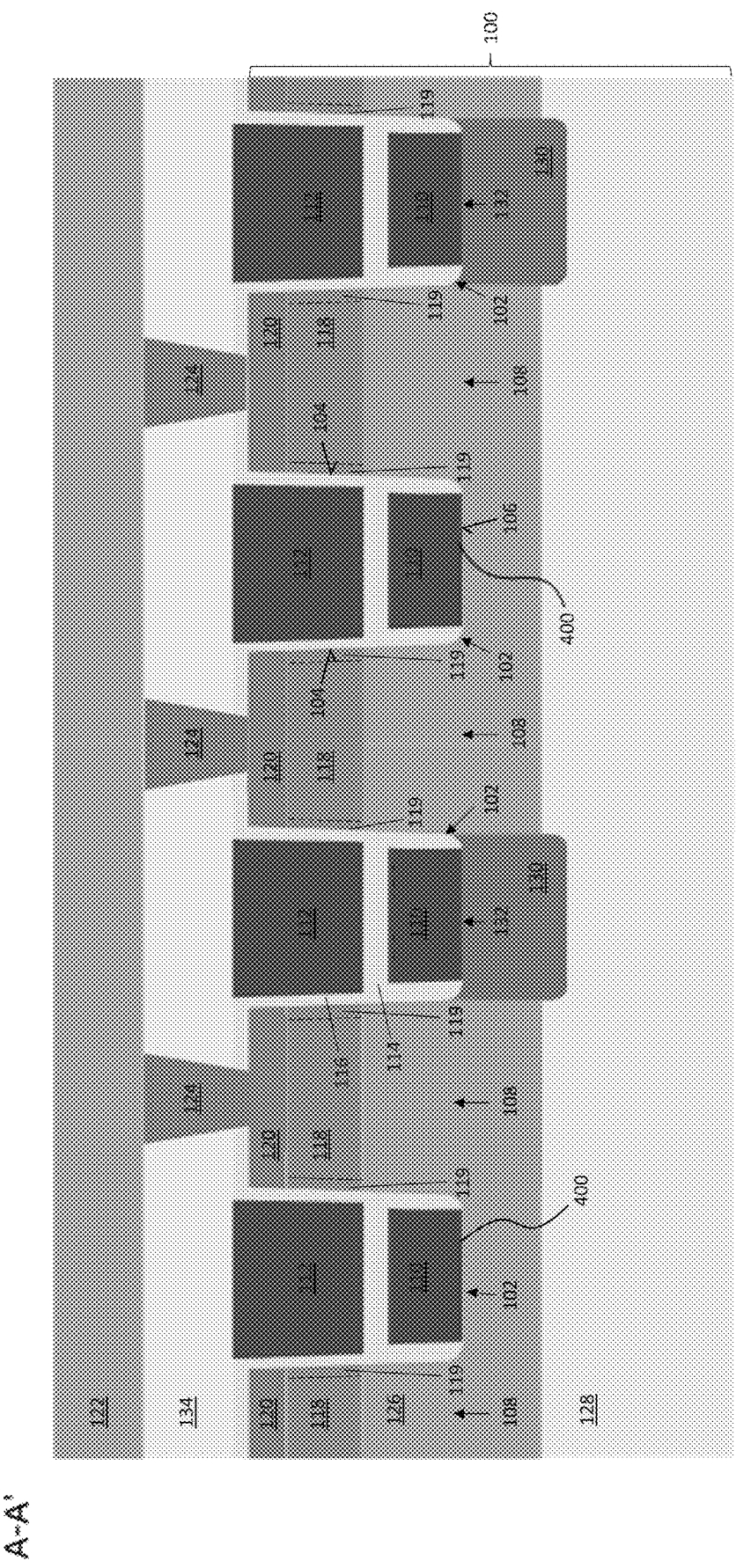

FIG. 9 illustrates a partial cross-sectional view of another embodiment of a semiconductor device which has shielding regions 130 of the second conductivity type and non-linear junctions 400 formed in SiC material 100. The embodiment shown in FIG. 9 is similar to the embodiment shown in FIG. 8. Different, however, the non-linear junctions 400 are formed between the SiC material 100 and the corresponding buried electrode 110 at the bottom 106 of the second subset of gate trenches 102. According to this embodiment, no metal is provided between the buried electrodes 110 in the first subset of gate trenches 102 and the underlying shielding regions 130, and no metal is provided between the buried electrodes 110 in the second subset of gate trenches 102 and the underlying non-linear junctions 400. In one embodiment, the buried electrode material is p+ polysilicon which forms a Schottky junction with n-doped SiC. For gate trenches 102 without underlying shielding regions 130, good ohmic contact between the buried electrodes 110 (e.g. doped polysilicon or metal) and p-type SiC is desired. A pn diode or a Schottky diode is formed within the SiC material 100 between the shielding regions 130 and the oppositely-doped drift region 128.

Figure 11:
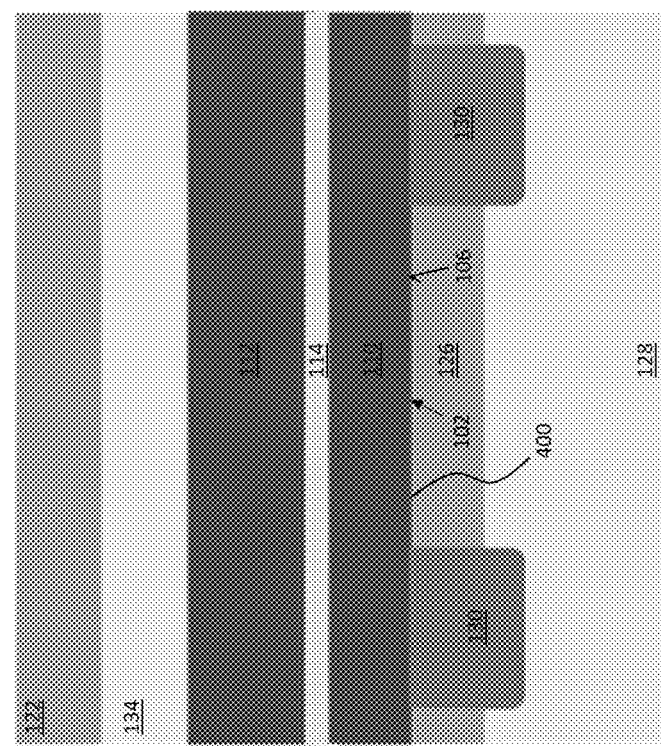
Figure 10:
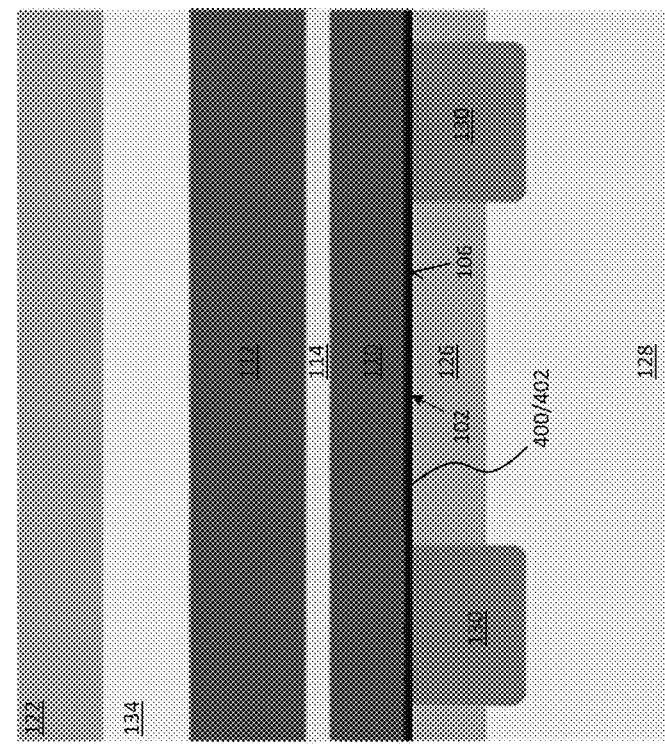

FIGS. 10 and 11 illustrate respective partial cross-sectional views of additional embodiments of a semiconductor device which has shielding regions 130 of the second conductivity type and non-linear junctions 400 formed in SiC material 100. The embodiments shown in FIGS. 10 and 11 are similar to the embodiment shown in FIGS. 1-4, and are taken along the same cross-sectional line C-C' as in FIG. 4. In FIG. 10, a metal 402 is formed below the buried electrode 110 at the bottom 106 of the second subset of gate trenches 102. According to this embodiment, the non-linear junctions 400 are Schottky junctions formed between the SiC material 100 and the metal 402 at the bottom 106 of the second subset of gate trenches 102. The non-linear junctions 400 may be formed by removing the insulating material 114 from the bottom 106 of the second subset of gate trenches 102 and depositing the metal 402 in the trench bottom 106 before depositing the buried electrode material. In FIG. 11, the metal is omitted from the bottom 106 of the second subset of gate trenches 102. According to this embodiment, the non-linear junctions 400 are formed between the SiC material 100 and the corresponding buried electrode 110 in the lower part of the second subset of gate trenches 102. The non-linear junctions 400 may be formed by depositing the buried electrode material in the lower part of the second subset of gate trenches 102 without first depositing a metal on the trench bottom 106, so that the buried electrodes 110 in the second subset of gate trenches 102 are in contact with the exposed SiC material 100.

Figure 14:
FIGS. 12 through 14 illustrate respective partial top-down plan views of different embodiments of a shielding region layout in conjunction with a non-linear junction layout for a SiC-based semiconductor device.
Figure 13:
Figure 12:

FIGS. 12 through 14 illustrate respective partial top-down plan views of different embodiments of the shielding region layout in conjunction with the non-linear junction layout. The layouts are shown with respect to the gate trenches 102, but the contents of the gate trenches 102 are not shown so that the shielding regions 130 and non-linear junctions 400 are visible.

In FIG. 12, the shielding regions 130 are segmented and extend in parallel with one another in lines that run parallel to the gate trenches 102 and to the non-linear junctions 400 formed with the SiC material 100 at the bottom 106 of the gate trenches 102. In FIG. 13, some of the shielding regions 130 are segmented and other ones of the shielding regions 130 are contiguous over the length of the gate trenches 102. The non-linear junction 400 formed below the contiguous shielding region 130 is out of view in FIG. 13. In FIG. 14, the segmented shielding regions 130 are arranged in a checkerboard-like pattern. In each embodiment illustrated in FIGS. 12 through 14, the shielding region layout may be formed by providing a mask layer for the shielding region implant in the region of the trench structure. A deep implantation process is performed with the mask layer. A multi-layer or single-layer epitaxy process may be used to form the SiC material 100 in which the shielding regions 130 are formed, as previously described herein.

Figure 15:
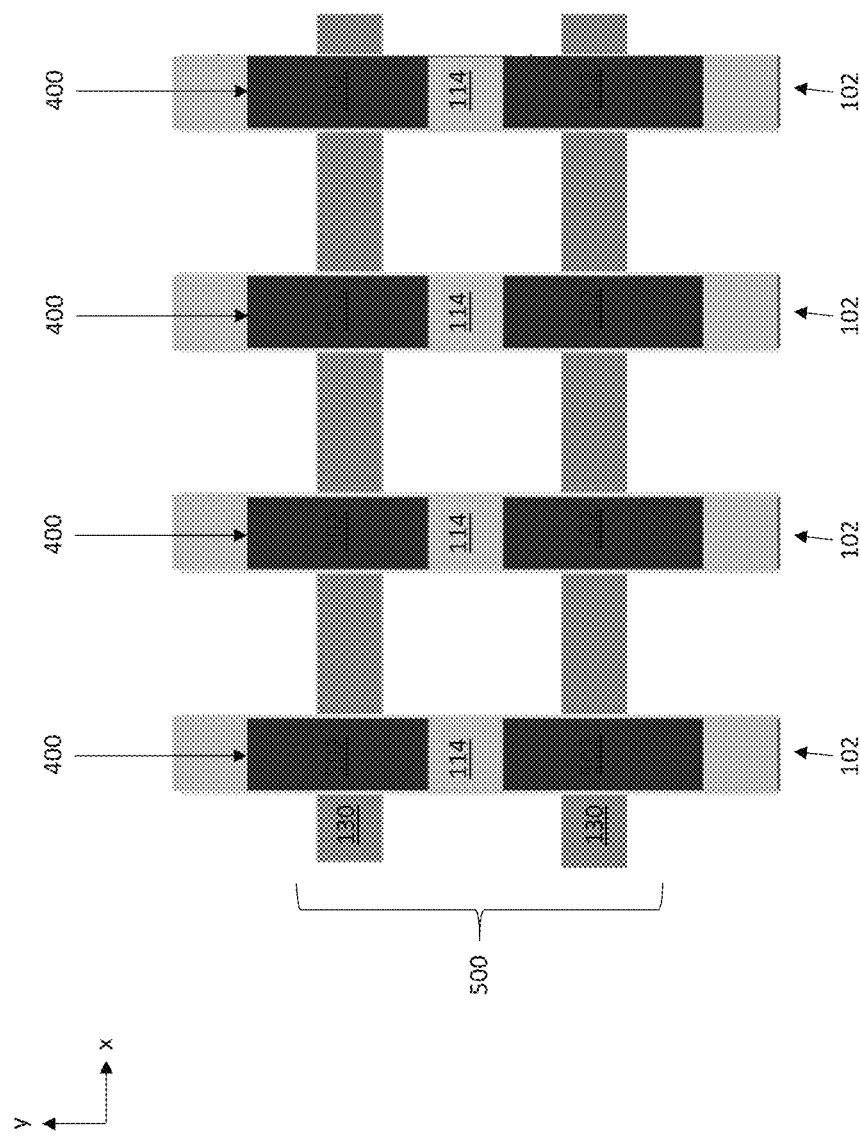
FIG. 15 illustrates a partial top-down plan view of another embodiment of a shielding region layout in conjunction with a non-linear junction layout for a SiC-based semiconductor device.

FIG. 15 illustrates a partial top-down plan view of another embodiment of the shielding region layout in conjunction with the non-linear junction layout. According to this embodiment, an insulating material 114 is present at the bottom 106 of the gate trenches 102 between adjacent rows 500 of the shielding regions 130 to divide the non-linear junction 400 in the same gate trench 102 into a plurality of non-linear junction segments 502 separated from one another by the insulating material 114. The non-linear junction segments 502 may be formed by forming openings in the insulating material 114 at the bottom 106 of the gate trenches 102 and depositing a metal at the trench bottom 106 before depositing the buried electrode material, or just depositing the buried electrode material in the lower part of the gate trenches 102. The shielding regions 130 formed in the SiC material 100 below the gate trenches 102 may be formed in stripes along a direction (x) transverse to the lengthwise extension (y) of the gate trenches 102 as shown in FIG. 15, or instead may be segmented along the transverse direction (x). The transverse direction (x) may or may not be orthogonal to the lengthwise extension (y) of the gate trenches 102, as previously explained herein.

In some embodiments, the shielding regions 130 are arranged only at the bottom of a first subset of gate trenches 102 and the non-linear junctions 400 are arranged only at the bottom of a second subset of gate trenches 102. In this case, the shielding regions 130 and the non-linear junctions 400 may alternate along a direction transverse (e.g. with an angle of at least 40° and at most 140°) to the sidewalls of the gate trenches 102 (e.g., transverse to the lengthwise extension in case of stripe-shaped trenches). In other embodiments, at least one of the shielding regions 130 and the non-linear junctions 400 may be arranged at the bottom of the first subset of gate trenches 102 and at the bottom of the second subset of gate trenches 102. In this case, the shielding regions 130 and the non-linear junctions 400 may alternate at least along a direction parallel to the bottom of the gate trenches 102 (e.g., along the lengthwise extension in case of stripe-shaped trenches). In addition, the shielding regions 130 and the non-linear junctions 400 may also alternate along one of the gate trenches 102, in particular along the lengthwise extension.

Figure 16:
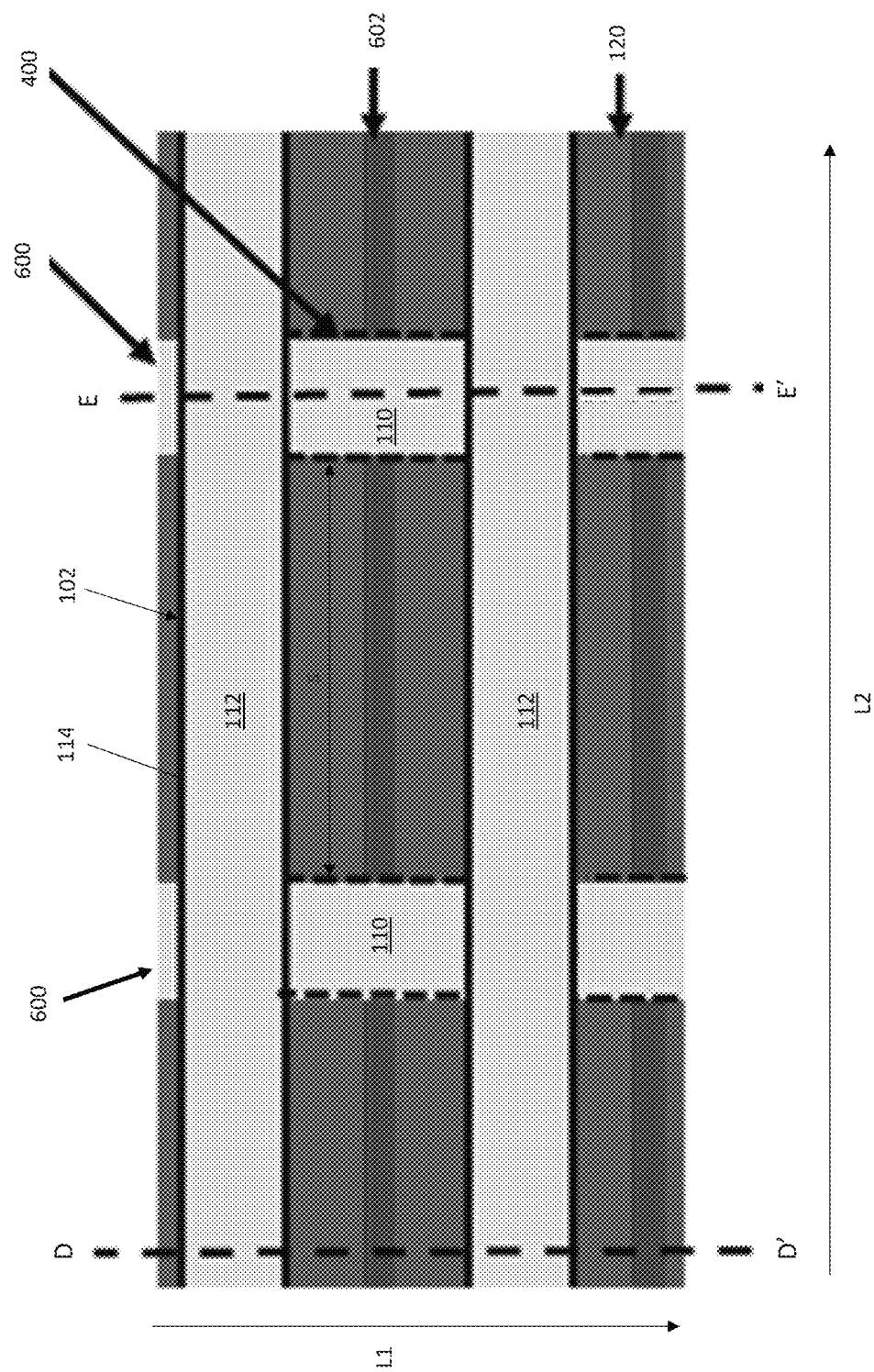
FIG. 16 illustrates a partial top plan view of another embodiment of a semiconductor device having shielding regions formed in a SiC material.
Figure 17:
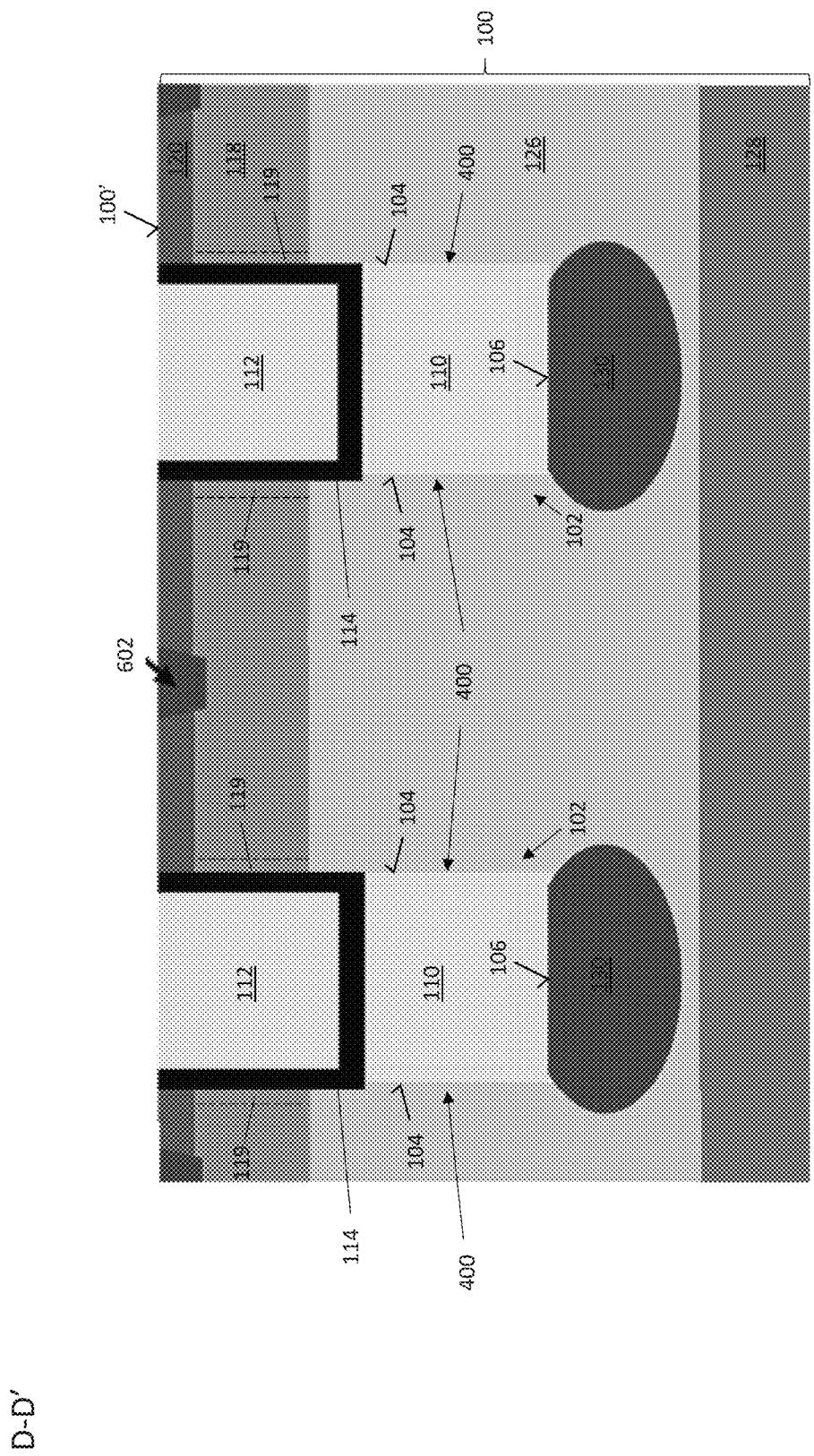
FIG. 17 illustrates a cross-sectional view of the semiconductor device along the line labelled D-D' in FIG. 16.
Figure 18:
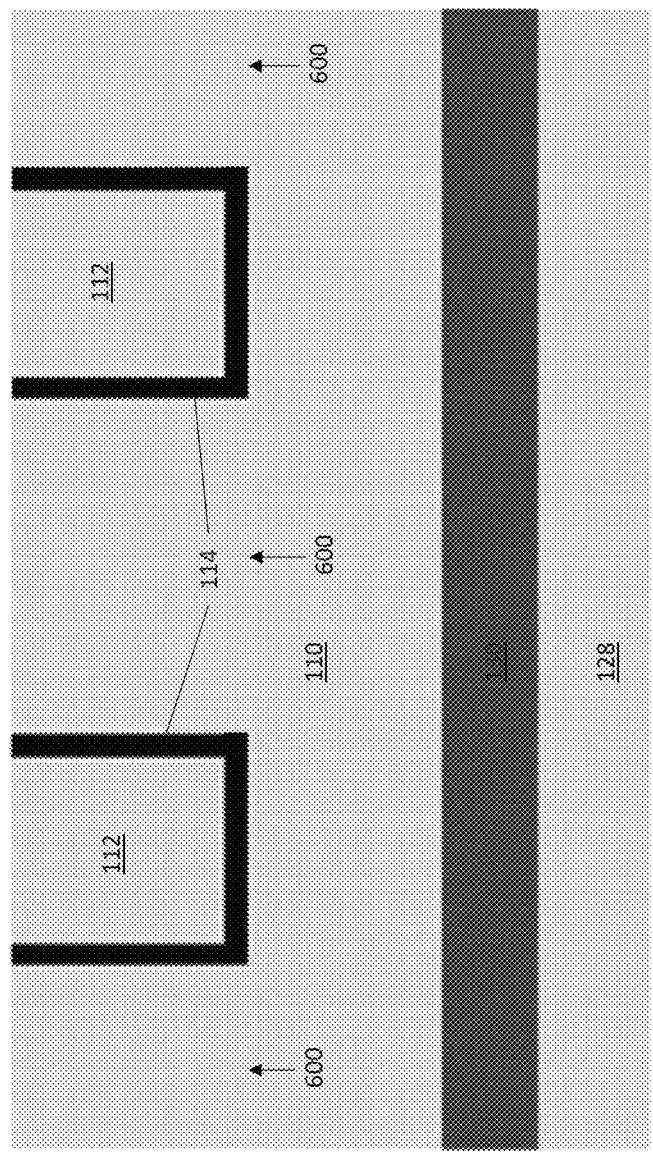
FIG. 18 illustrates a cross-sectional view of the semiconductor device along the line labelled E-E' in FIG. 16.

FIG. 16 illustrates a partial top-down plan view of another embodiment of the shielding region layout in conjunction with the non-linear junction layout. FIG. 17 illustrates a cross-sectional view of the semiconductor device along the line labelled D-D' in FIG. 16. FIG. 18 illustrates a cross-sectional view of the semiconductor device along the line labelled E-E' in FIG. 16.

According to the embodiment illustrated in FIGS. 16 through 18, the non-linear junction 400 is a Schottky junction formed between the buried electrode 110 and the SiC material 100 in the lower part of the gate trenches 102. That is, the buried electrode 110 contacts the SiC material 100 in the lower part of the gate trenches 102 to form the Schottky junction 400. To yield such a structure, the insulating material 114 is omitted from the lower part of the gate trenches 102 where each buried electrode 110 is disposed.

Further according to this embodiment, the shielding region 130 of the second conductivity type is formed at the bottom 106 of the gate trenches 102 where the insulating material 114 is omitted. This approach yields a dual poly/metal SiC trench MOSFET having excellent shielding of the body region 118 and the Schottky junction 400 formed between the buried electrode 110 and the SiC material 100 in the lower part of the gate trenches 102. In this way, neither active MOSFET area nor diode area is lost. By adjusting the depth of the gate trenches 102, the Schottky junction 400 area can be tuned to exactly the desired size. Furthermore, since no insulating material 114 is used to isolate the buried electrodes 110 from the surrounding SiC material 100, no additional screening test is required.

Additional (contact) trenches 600 may be formed in the SiC material 100 for contacting the buried electrodes 110. The contact trenches 600 extend into the same top surface 100' of the SiC material 100 as the gate trenches 102. The contact trenches extend lengthwise in a direction L1 which is transverse to the lengthwise extension direction L2 of the gate trenches 102. In one embodiment, the lengthwise extension direction L1 of the contact trenches 600 is perpendicular to the lengthwise extension direction L2 of the gate trenches 102. The contact trenches 600 may be filled with the same material as the buried electrodes 110, to provide a point of contact for the buried electrodes 110 at the top surface 100' of the SiC material 100. That is, the material of the buried electrodes 110 may extend to the top surface 100' of the SiC material 100 between the gate trenches 102 according to this embodiment.

The additional trenches 600 are implemented with the Schottky junction 400 at the side walls of the buried electrodes 110 according to the embodiment shown in FIGS. 16 through 18. Spacing 's' of the additional trenches 600 is determined by the Schottky diode forward voltage and/or potential failure modes that arise from the potential drop within the buried electrodes 110. The buried electrodes 110 according to this embodiment may be formed using the same process steps used to form the buried electrodes 110 for the other devices described herein, but by omitting formation of the insulating material 114 along the sidewalls 104 and the bottom 106 in the lower part of the gate trenches 102.

In one embodiment, the additional trenches 600 include isolation from the surrounding SiC material 100 except in the lower part of the trenches 600 where the Schottky junction 400 is formed. That is, the sidewalls of the additional trenches 600, which are illustrated with dashed lines in FIGS. 16 and 19, may be optionally insulated, e.g., lined with a dielectric material down to a level below the body regions 118. Any standard trench dielectric liner may be used. For example, a gate dielectric may be used. The dielectric material, schematically represented by the dashed lines in FIGS. 16 and 19, lines the upper part of the sidewalls of the additional trenches 600 and provides isolation for the adjacent body and source regions 118, 120. According to this embodiment, the upper part of the buried electrodes 110 does not come into direct contact with either the body regions 118 or the source regions 120. The dielectric material is omitted from the additional trenches 600 at a level below the gate electrodes 112, so that the buried electrodes 110 contact the adjacent SiC material 400 to form the Schottky junction 400.

A contact region 602 of the second conductivity type may extend through the source region 120 to the body region 118. The contact region 602 is doped more heavily than the body region 118, e.g., p+ in the case of p-type as the second conductivity type to improve ohmic contact with the body region 118. In one embodiment, the contact regions 602 have the same lengthwise extension L2 as the gate trenches 102.

The embodiments described herein provide a Schottky contact directly between the buried electrodes 110 and the SiC material 100, or through a metal liner 402 interposed between the buried electrodes 110 and the SiC material 100. The bottom 106 of the gate trenches 102 may either be an open contact to form a body diode, or the bottom 106 of the gate trenches 102 may be isolated with an insulating material 114 to avoid body diode operation.

Figure 19:
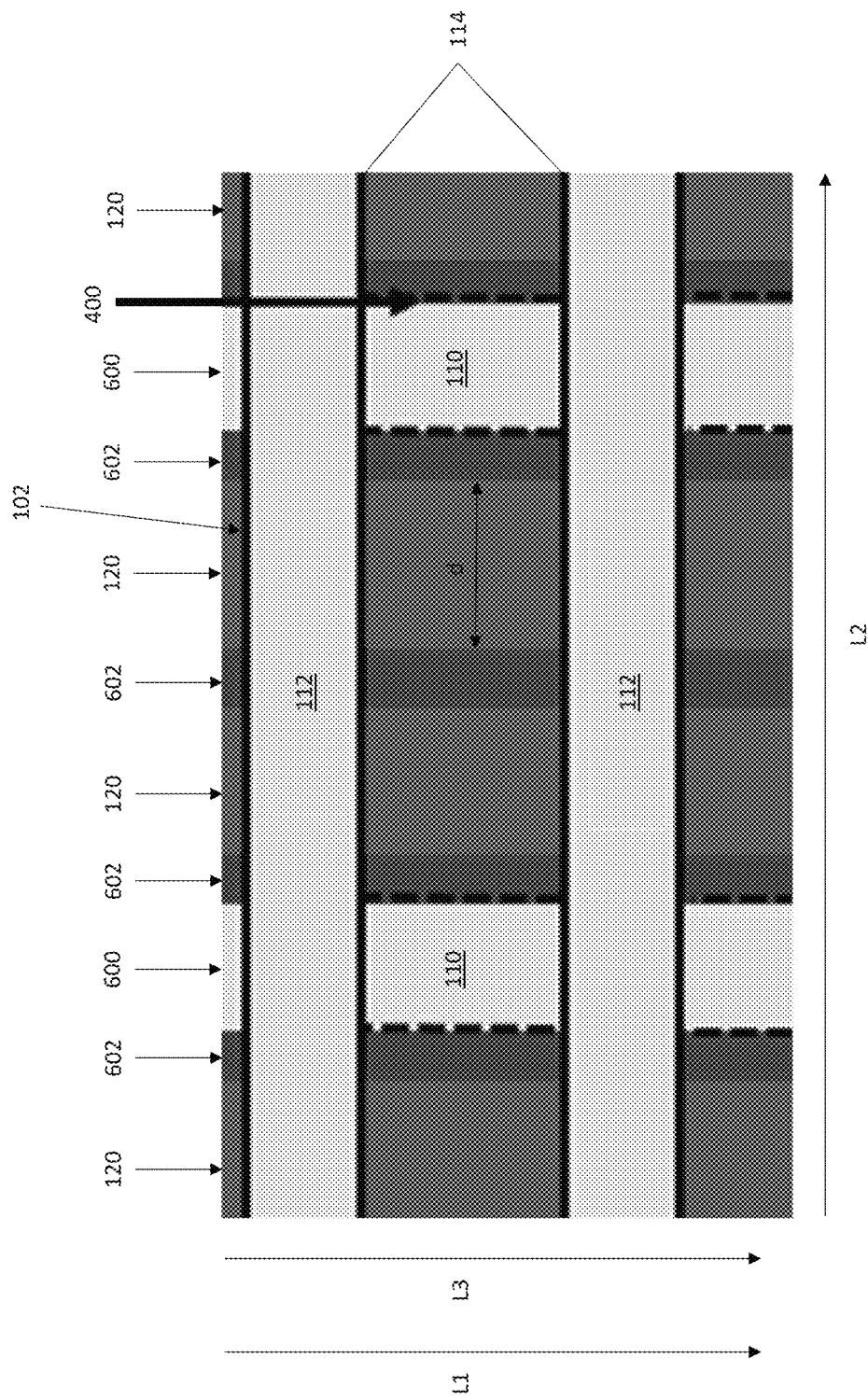
FIG. 19 illustrates a partial top plan view of another embodiment of a semiconductor device having shielding regions formed in a SiC material.

FIG. 19 illustrates a partial top-down plan view of another embodiment of the shielding region layout in conjunction with the non-linear junction layout. To reduce processing complexity and realize smaller mesas, e.g., <1 μm, the highly doped contact regions 602 are formed as stripes which extend lengthwise is a direction L1 which is transverses to the lengthwise extension direction L2 of the gate trenches 102. In one embodiment, the lengthwise extension direction L3 of the highly doped contact regions 602 is perpendicular to the lengthwise extension direction L2 of the gate trenches 102. For example, the contact trenches 600 and the highly doped contact regions 602 may have the same lengthwise extension direction (L1-L3) which is perpendicular to the lengthwise extension direction L2 of the gate trenches 102. The easier processing flow comes at the expense of active area loss in the region of the stripes of highly doped contact regions 602 and/or non-optimal contact to the underlying body regions 120. The distance 'd' between the stripes of highly doped contact regions 602 is a tradeoff between robustness and performance.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a SiC material of a first conductivity type;
a plurality of trenches extending into the SiC material, each trench having opposing sidewalls and a bottom;
a first electrode formed in a lower part of the plurality of trenches;
a second electrode formed in an upper part of the plurality of trenches and insulated from both the first electrode and the SiC material;
a body region of a second conductivity type adjacent the opposing sidewalls of each trench, wherein a conductive channel is configured to form in the body region along the opposing sidewalls of the plurality of trenches;
a source region of the first conductivity type above the body region and adjacent the opposing sidewalls of each trench;
a shielding region of the second conductivity type at the bottom of at least a first subset of the trenches, each shielding region being electrically connected to the corresponding first electrode through an opening in an insulating material at the bottom of the at least first subset of the trenches; and
a non-linear junction formed with the SiC material of at least a second subset of the trenches.

2. The semiconductor device of claim 1, wherein the at least second subset of the trenches is different from the at least first subset of the trenches.

3. The semiconductor device of claim 1, wherein the at least second subset of the trenches is equal or at least partially overlapping with the at least first subset of the trenches, and wherein the non-linear junction is formed at the sidewalls of the lower part of the at least second subset of the trenches.

4. The semiconductor device of claim 1, wherein the non-linear junction is formed between the SiC material and the first electrode at the bottom of the at least second subset of the trenches.

5. The semiconductor device of claim 4, wherein the first electrode formed in the lower part of the plurality of trenches comprises doped polysilicon.

6. The semiconductor device of claim 1, wherein a metal is formed below the first electrode in the at least second subset of the trenches, wherein the non-linear junction is a Schottky junction, and wherein the Schottky junction is formed between the SiC material and the metal at the bottom of the at least second subset of the trenches.

7. The semiconductor device of claim 6, wherein the first electrode formed in the lower part of the plurality of trenches comprises a semiconductor material.

8. The semiconductor device of claim 6, wherein the first electrode contacts the shielding region at the bottom of the at least first subset of the trenches.

9. The semiconductor device of claim 6, wherein a metal is formed below the first electrode in the at least first subset of the trenches, and wherein the metal contacts the shielding region at the bottom of the at least first subset of the trenches.

10. The semiconductor device of claim 1, wherein the shielding regions and the non-linear junctions are arranged in an alternating manner below the plurality of trenches.

11. The semiconductor device of claim 1, wherein the shielding regions are arranged at corners of a grid or wherein the shielding regions form part of a grid.

12. The semiconductor device of claim 1, wherein the shielding regions extend in parallel with one another in lines that run parallel to the plurality of trenches, and wherein the shielding regions have a different pitch than the plurality of trenches.

13. The semiconductor device of claim 1, wherein the shielding regions are arranged at the bottom of the at least first subset of the trenches and at the bottom of the at least second subset of the trenches, and wherein some of the shielding regions are segmented and other ones of the shielding regions are contiguous over a length of the plurality of trenches.

14. The semiconductor device of claim 1, wherein the shielding regions are arranged in rows which run in a direction transverse to a lengthwise extension of the plurality of trenches.

15. A semiconductor device, comprising:
a SiC material of a first conductivity type;
a gate trench extending into a first main surface of the SiC material and having sidewalls and a bottom;
a contact trench extending into the first main surface of the SiC material and extending lengthwise in a direction which is transverse to a lengthwise extension direction of the gate trench;

a buried electrode formed in a lower part of the gate trench;

a gate electrode formed in an upper part of the gate trench and insulated from the buried electrode and the SiC material;

a body region of a second conductivity type adjacent the sidewalls of the gate trench, wherein a conductive channel is configured to form in the body region along the sidewalls of the gate trench;

a source region of the first conductivity type above the body region and adjacent the sidewalls of the gate trench; and a shielding region of the second conductivity type in contact with the buried electrode at the bottom of the gate trench, wherein the buried electrode is in contact with the SiC material at the sidewalls in the lower part of the gate trench to form a Schottky junction.

16. The semiconductor device of claim 15, wherein a material of the buried electrode extends to the first main surface of the SiC material adjacent the gate trench.

17. The semiconductor device of claim 15, further comprising a contact region of the second conductivity type extending through the source region and into the body region, wherein the contact region is doped more heavily than the body region.

18. The semiconductor device of claim 17, wherein the contact region of the second conductivity type extends in a same lengthwise direction as the gate trench.

19. The semiconductor device of claim 17, wherein the contact region of the second conductivity type extends lengthwise in a first direction which is transverse to a lengthwise extension direction of the gate trench.

20. A semiconductor device, comprising:

a SiC material of a first conductivity type;

a gate trench extending into a first main surface of the SiC material and having sidewalls and a bottom;

a buried electrode formed in a lower part of the gate trench;

a gate electrode formed in an upper part of the gate trench and insulated from the buried electrode and the SiC material;

a body region of a second conductivity type adjacent the sidewalls of the gate trench, wherein a conductive channel is configured to form in the body region along the sidewalls of the gate trench;

a source region of the first conductivity type above the body region and adjacent the sidewalls of the gate trench; and a shielding region of the second conductivity type in contact with the buried electrode at the bottom of the gate trench, wherein the buried electrode is in contact with the SiC material at the sidewalls in the lower part of the gate trench to form a Schottky junction, wherein a material of the buried electrode extends to the first main surface of the SiC material adjacent the gate trench.

* * * * *